United States Patent
Chun et al.

(10) Patent No.: US 10,468,994 B2
(45) Date of Patent: Nov. 5, 2019

(54) INVERTER FOR DRIVING MOTOR OF VEHICLE

(71) Applicants: HYUNDAI MOTOR COMPANY, Seoul (KR); KIA MOTORS CORPORATION, Seoul (KR)

(72) Inventors: Ho Tae Chun, Daejeon (KR); Se Min Woo, Seoul (KR); Chang Han Jung, Hwaseong-si (KR); Yun Ho Kim, Seoul (KR); Jeong Yun Lee, Hwaseong-si (KR); Seung Hyun Han, Yongin-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/009,025

(22) Filed: Jun. 14, 2018

(65) Prior Publication Data

US 2018/0294739 A1 Oct. 11, 2018

Related U.S. Application Data

(63) Continuation of application No. 15/616,322, filed on Jun. 7, 2017, now abandoned.

(30) Foreign Application Priority Data

Nov. 30, 2016 (KR) .................. 10-2016-0161256

(51) Int. Cl.
  *H02M 7/00* (2006.01)
  *H05K 7/20* (2006.01)
  (Continued)

(52) U.S. Cl.
  CPC ........ *H02M 7/003* (2013.01); *H02K 11/0094* (2013.01); *H02K 11/33* (2016.01); *H05K 7/20927* (2013.01)

(58) Field of Classification Search
  CPC ...... H05K 7/20927; H05K 7/209; H05K 7/02; H05K 7/20; H05K 7/2089; H05K 7/1432;
  (Continued)

(56) References Cited

U.S. PATENT DOCUMENTS

| | | | |
|---|---|---|---|
| 8,376,069 B2 * | 2/2013 | Nakatsu | B60L 11/00 180/65.21 |
| 2007/0109715 A1 * | 5/2007 | Azuma | B60K 6/28 361/299.3 |

(Continued)

FOREIGN PATENT DOCUMENTS

KR    10-2015-0065093 A    6/2015

*Primary Examiner* — James Wu
*Assistant Examiner* — Michael A Matey
(74) *Attorney, Agent, or Firm* — McDonnell Boehnen Hulbert & Berghoff LLP

(57) ABSTRACT

An inverter for driving a motor of a vehicle mediating between a battery and a driving motor is disclosed. The inverter includes a power storage module, a power module, and a cooling module. The power storage module is configured to be supplied with power from the battery. The power module is configured to be supplied with power from the power storage module to transfer the power to the driving motor. The cooling module is configured to be installed between the power storage module and the power module to simultaneously cool the power storage module and the power module.

6 Claims, 5 Drawing Sheets

(51) Int. Cl.
*H02K 11/00* (2016.01)
*H02K 11/33* (2016.01)

(58) Field of Classification Search
CPC ............ H05K 7/20254; H05K 5/0026; H05K 7/20218; H05K 7/20854; H05K 7/20872; H05K 7/20945; B60L 15/007; B60L 2240/525; B60L 3/003; B60L 2210/40; B60L 2240/36; B60L 11/005; B60L 15/20; B60L 2210/30; Y02T 10/7022; Y02T 10/7077; Y02T 10/7005; Y02T 10/7044; H01G 2/08
See application file for complete search history.

(56) References Cited

U.S. PATENT DOCUMENTS

| | | | | |
|---|---|---|---|---|
| 2008/0130223 | A1* | 6/2008 | Nakamura | H02M 7/003 361/689 |
| 2008/0237847 | A1* | 10/2008 | Nakanishi | H01L 23/473 257/722 |
| 2011/0304948 | A1* | 12/2011 | Lee | H01G 9/155 361/301.1 |
| 2013/0223009 | A1* | 8/2013 | Nakatsu | H02M 7/003 361/699 |
| 2015/0313040 | A1* | 10/2015 | Nakatsu | H02M 7/003 361/699 |

\* cited by examiner

INVERTER FOR DRIVING MOTOR OF VEHICLE

CROSS REFERENCE TO RELATED APPLICATION

The present application is a continuation of U.S. application Ser. No 15/616,322 filed on Jun. 7, 2017, which claims priority to Korean Patent Application No. 10-2016-0161256, filed on Nov. 30, 2016. The entire contents of both of these applications is incorporated herein for all purposes by this reference.

BACKGROUND OF THE DISCLOSURE

1. Technical Field

The present disclosure relates to an inverter for driving a motor of a vehicle, and more particularly, to an inverter for driving a motor of a vehicle mediating between a battery and a driving motor.

2. Description of the Related Art

Eco-friendly vehicles such as an electric vehicle, a hybrid vehicle, etc., are driven by a driving motor operated by electricity.

A vehicle is heavy, and therefore there is a need to increase the output of the driving motor in order to accelerate to a high speed. The output of the driving motor is determined by a magnitude, a frequency, etc., of an input voltage. In this case, the inverter including a power module is used to adjust the output while a DC current transferred from a battery is converted into an AC current.

Describing in more detail the configuration of the inverter typically used, as illustrated in FIGS. 1 and 2, the inverter is configured to include a power module 10, a power storage module 20, and a cooling module 30. The inverter may further include a housing (not illustrated) enclosing the components.

The power module 10 is a core component that is supplied with the DC current, converts the DC current into the AC current and controls an output and a frequency of a motor. The power storage module 20 is a component that temporarily stores a current supplied from a battery to constantly keep electric energy supplied to the power module 10 and takes up a largest volume in the inverter. The cooling module 30 is a component for cooling the power module 10 that generates heat during the conversion process of current. The inside of the cooling module 30 is provided with a plurality of cooling passages and thus has cooling water, etc., circulated in the cooling passages to cool the power module 10.

To reduce the volume of the inverter, there is a need to optimize, in particular, a size of the power storage module 20 among the foregoing components. The power storage module 20 comprises a capacitor that is proportional to a size and power storage capacity. Here, the power storage module 20 deteriorates when the temperature of the components is increased and thus the power storage capacity thereof is reduced. As a result, minimum capacity, that is, a minimum volume of the power storage module 20 is calculated in consideration of that aspect.

If the power storage module 20 can be effectively cooled, the volume of the power storage module may be minimized. But if the cooling is not appropriately made and thus temperature is increased, the volume of the power storage module 20 needs to be increased to take in account the deterioration in the power storage capacity.

Meanwhile, if the distance between the power module 10 and the power storage module 20 is increased, leakage inductance is increased, such that deterioration in performance is caused due to a momentary voltage spike. Therefore, the related art has used a structure in which the power module 10 and the power storage module 20 are installed directly adjacent to each other.

For existing inverters, FIG. 1 illustrates a vertical coupling structure and FIG. 2 illustrates a horizontal coupling structure. As illustrated, when the power module 10 and the power storage module 20 are adjacent to each other, as illustrated in FIG. 1, the power storage module 20 and the cooling module 30 are spaced apart from each other and thus the power storage module 20 may not be cooled by the cooling module 30. Alternately, when the power module 10 and the power storage module 20 are adjacent to each other as illustrated in FIG. 2, the size of the cooling module 30 becomes excessively large, thus causing the size of the inverter to become large.

Therefore, a new inverter structure capable of maintaining performance by minimizing leakage inductance occurring between the power module 10 and the power storage module 20 while minimizing the size of the power storage module 20 by cooling both the power module 10 and the power storage module 20 is required.

The matters described as the related art have been provided only for assisting in the understanding for the background of the present disclosure and should not be considered as corresponding to the related art known to those skilled in the art.

SUMMARY OF THE DISCLOSURE

An object of the present disclosure is to provide an inverter for driving a motor of a vehicle capable of minimizing a volume and leakage inductance.

According to an exemplary embodiment of the present disclosure, there is provided an inverter for driving a motor of a vehicle mediating between a battery and a driving motor, including: a power storage module configured to be supplied with power from the battery; a power module configured to be supplied with power from the power storage module to transfer the power to the driving motor; and a cooling module configured to be installed between the power storage module and the power module to simultaneously cool the power storage module and the power module.

The inverter may further include: a connection module configured to connect the power storage module and the power module to transfer power. The connection module may be formed in a structure having a plus plate connecting a plus terminal of the power storage module and a plus terminal of the power module and a minus plate connecting a minus terminal of the power storage module and a minus terminal of the power module are stacked in an insulated state.

The plus plate and the minus plate may each be formed in the shape of the letter L and have a first surface inserted between the power storage module and the cooling module and a second surface extending along a side surface of the cooling module from one end of the first surface, and a first surface of the plus plate and a first surface of the minus plate may be stacked and a second surface of the plus plate and a second surface of the minus plate may each be installed to contact each other while being stacked.

The connection module may further include a plus terminal extending from a second surface of the plus plate to be connected to a plus terminal of the power module and a minus terminal extending from a second surface of the minus plate to be connected to a minus terminal of the power module.

The first surface of the plus plate or the first surface of the minus plate may be provided with a through hole so that the first surface of the plus plate and the plus terminal of the power storage module contact each other and the first surface of the minus plate and the minus terminal of the power storage module contact each other.

The cooling module may cool the connection module and the power storage module may be indirectly cooled by the connection module cooled by the cooling module.

DESCRIPTION OF THE EMBODIMENTS

Terminologies used herein are to mention only a specific exemplary embodiment, and are not to limit the present disclosure. Singular forms used herein include plural forms as long as phrases do not clearly indicate an opposite meaning. A term "including" used in the present specification concretely indicates specific properties, regions, integer numbers, steps, operations, elements, and/or components, and is not to exclude presence or addition of other specific properties, regions, integer numbers, steps, operations, elements, components, and/or a group thereof.

All terms including technical terms and scientific terms used herein have the same meaning as the meaning generally understood by those skilled in the art to which the present disclosure pertains unless defined otherwise.

Hereinafter, an inverter for driving a motor of a vehicle according to an exemplary embodiment of the present disclosure will be described with reference to the accompanying drawings.

Figure 1:
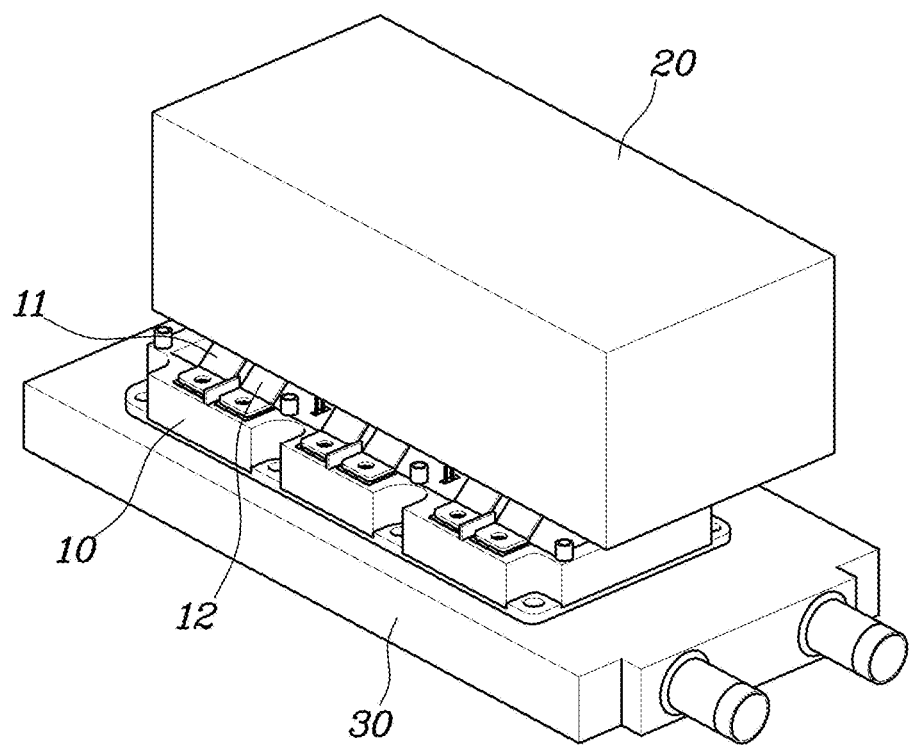
FIGS. 1 and 2 are diagrams illustrating the existing inverter layout.
Figure 2:
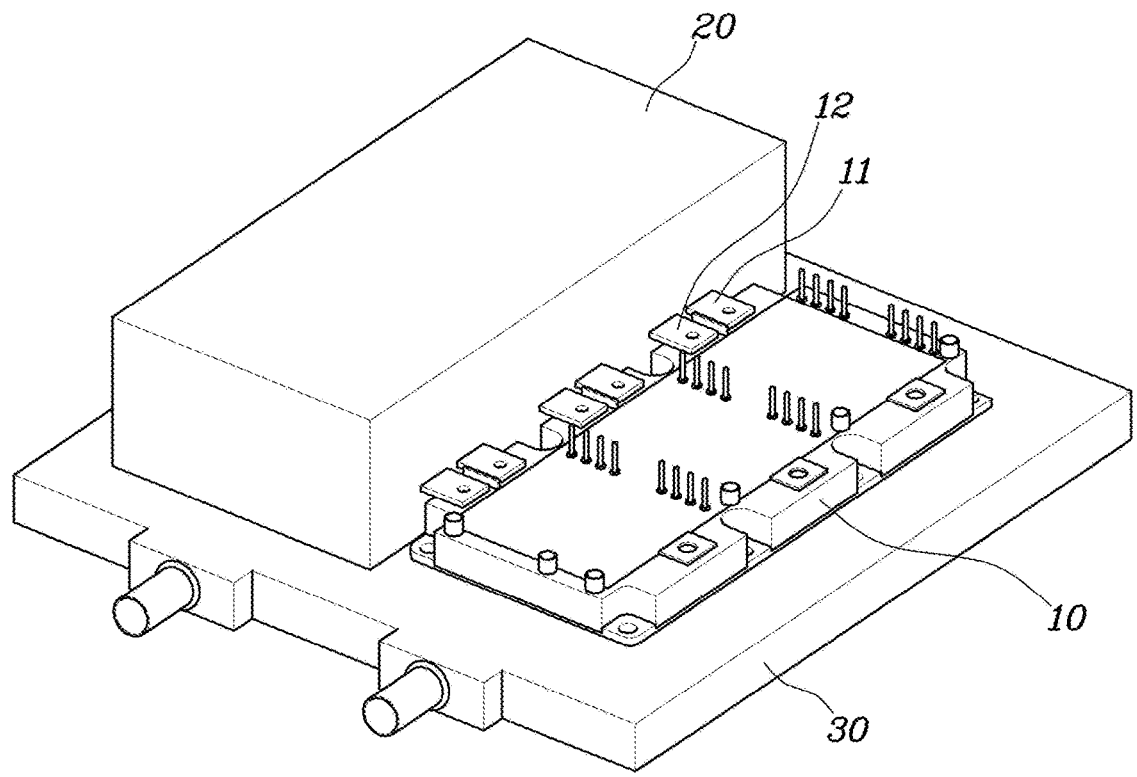
Figure 3:
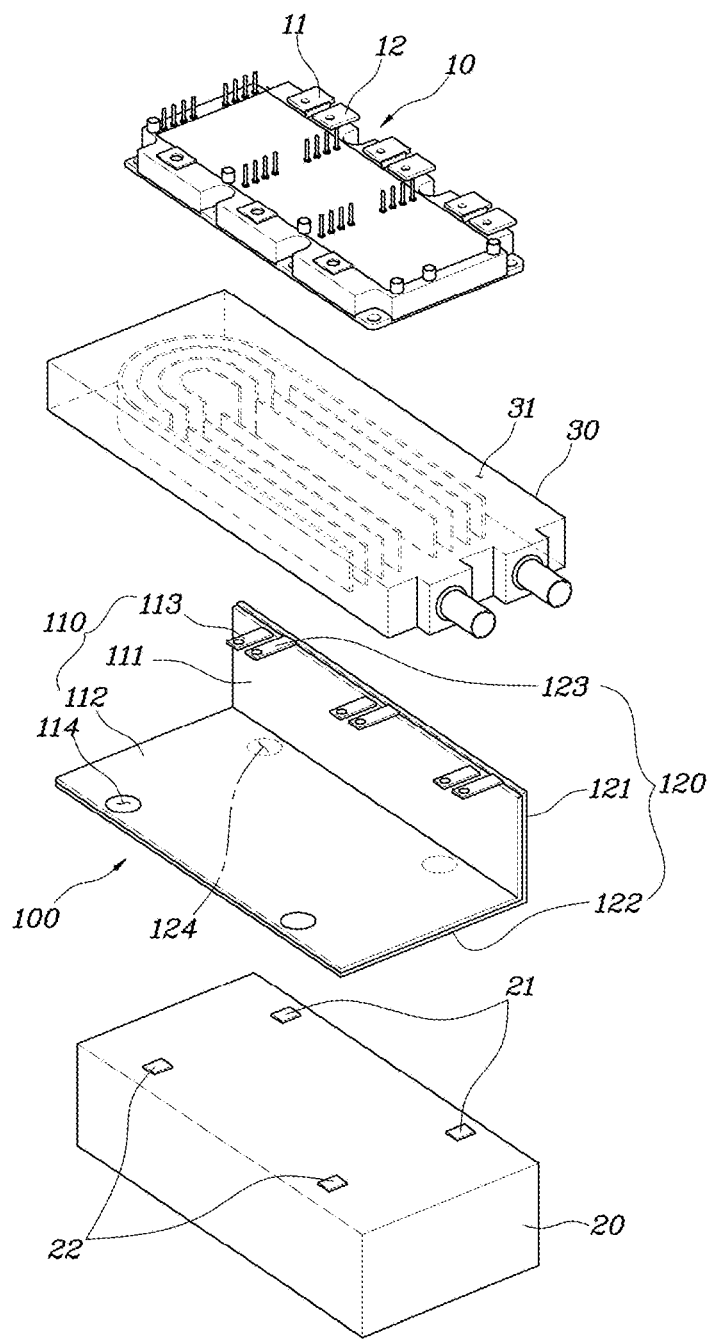
FIG. 3 is an exploded perspective view of an inverter according to an exemplary embodiment of the present disclosure.

As illustrated in FIG. 3, an inverter according to an exemplary embodiment of the present disclosure is configured to include a power module 10, a power storage module 20, a cooling module 30, like the existing inverter, illustrated in FIGS. 1 and 2. The inside of the cooling modules 30 is provided with a plurality of cooling passages 31, and thus has cooling water, etc. circulated in the cooling passages to cool the power module 10. In addition, the inverter further includes a connection module 100 for minimizing leakage inductance occurring between the power module 10 and the power storage module 20.

According to the exemplary embodiment of the present disclosure, the power module 10, the cooling module 30, and the power storage module 20 are sequentially disposed so that the cooling module 30 and the power storage module 20 may contact each other to effectively cool the power storage module 20. Thus, the cooling module 30 may simultaneously cool the power module 10 and the power storage module 20.

As such, the cooling module 30 is disposed between the power module 10 and the power storage module 20 to effectively cool the power storage module 20, thereby minimizing the overall volume of the inverter.

However, the power module 10 and the power storage module 20 are spaced apart from each other by the thickness of the cooling module 30. Therefore, a connection module 100 having a laminate bus bar structure is installed to minimize the increased leakage inductance.

The connection module 100 has a stacked structure in which a plus plate 110 and a minus plate 120 are coupled with each other in an insulated state and may minimize the occurrence of leakage inductance by minimizing the distance therebetween while keeping a maximum contact area between both poles.

The plus plate 110 is configured to connect between a plus terminal 11 of the power module 10 and a plus terminal 21 of the power storage module 20. The minus plate 120 is configured to connect between a minus terminal 12 of the power module 10 and a minus terminal 22 of the power storage module 20.

Figure 4:
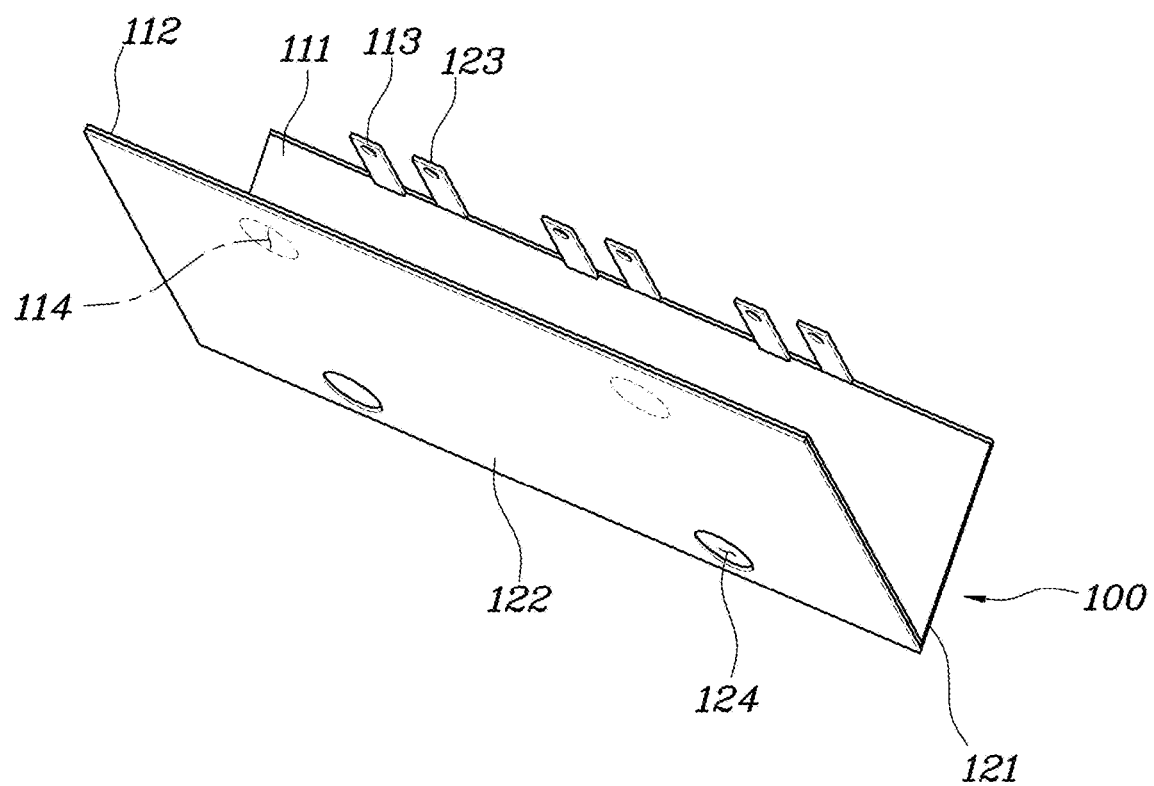
FIG. 4 is a perspective view of a connection module according to an exemplary embodiment of the present disclosure.

As illustrated in FIGS. 3 and 4, the plus plate 110 is configured in the shape of the letter L having a first surface 112 and a second surface 111 that extends perpendicularly from the first surface 112. The first surface 112 is inserted between the cooling module 30 and the power storage module 20 with the second surface 111 extending along a side surface of the cooling module 30. The minus plate 120 is also configured in the shape of the letter L and has a first surface 122 and a second surface 121 that extends perpendicularly from the first surface 122. The first surfaces 112 and 122 of the plus plate 110 and the minus plate 120 are stacked to contact each other and the second surfaces 111 and 121 of the plus plate 110 and the minus plate 120 contact each other to form the shape of the letter L.

The distance between the plus plate 110 and the minus plate 120 is minimized while the plus plate 110 and the minus plate 120 contact each other over a wide area. Thus, the leakage inductance of current transferred may also be minimized.

A method for coupling a plus plate 110 and a minus plate 120 in an insulated state is not particularly limited, but it is preferable to simultaneously obtain insulation and adhesion by coupling the plus plate 110 and the minus plate 120 using an adhesive having insulation.

The plus plate 110 further includes a plus terminal 113 extending from an end portion of the second surface 111 thereof. The plus terminal 113 extends toward the power module 10 from the end portion of the second surface located opposite side of the other end portion contact to the first surface 112.

The minus plate 120 further includes a minus terminal 123 extending from the second surface 121. The installation position and form of the terminal 123 are similar to that of the plus terminal 113.

The plus terminal 113 is connected to the plus terminal 11 of the power module 10 and the minus terminal 123 is connected to the minus terminal 12 of the power module 10. Here, the plus terminal 113 and the minus plate 120 and the minus terminal 123 and the plus plate 110 each are preferably separated from each other not to contact each other or coupled surfaces thereof are preferably insulated.

Both the first surface 112 of the plus plate 110 and the first surface 122 of the minus plate 120 are installed between the cooling module 30 and the power storage module 20. Here, the plus plate 110 and the minus plate 120 have a stacked structure. Therefore, only any one of the two plates may contact the power storage module 20.

Figure 5:
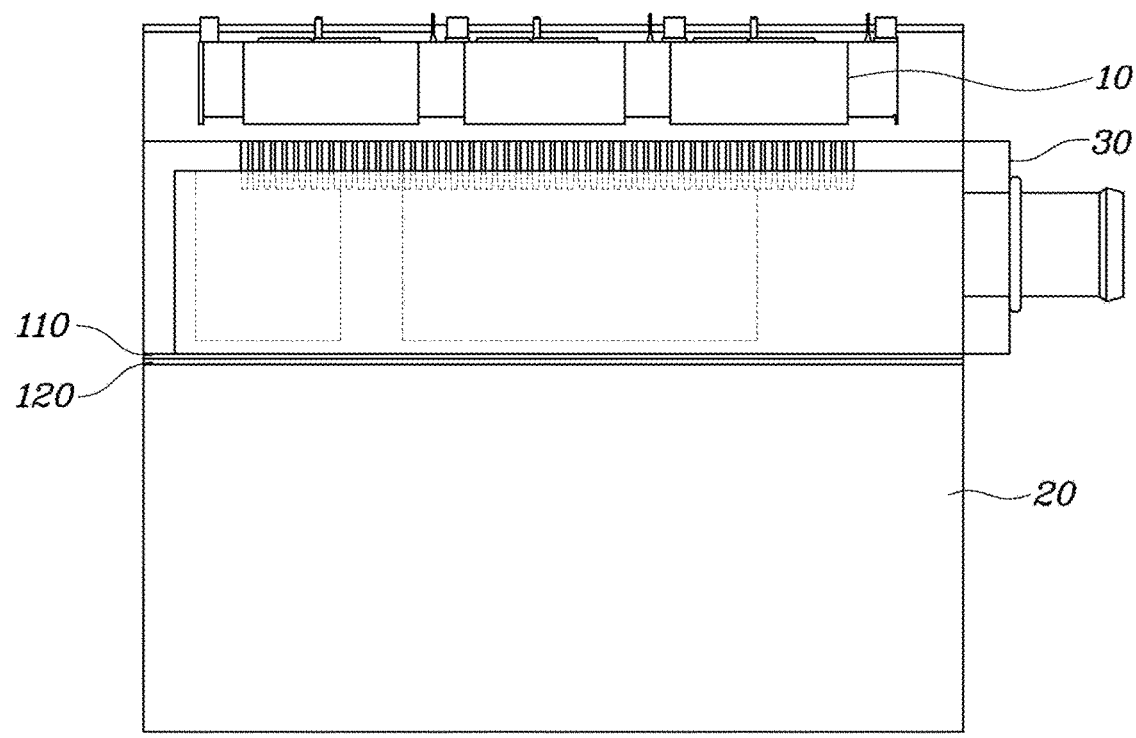
FIG. 5 is a side view of the inverter according to an embodiment of the present disclosure.

As illustrated in FIGS. 3 to 5, according to the exemplary embodiment of the present disclosure, the minus plate 120 is installed to contact the power storage module 20 and the plus plate 110 is installed to contact the cooling module 30.

In this case, the plus plate 110 may not be coupled with the plus terminal 21 of the power storage module 20. Therefore, a portion of the first surface 122 of the minus plate 120 is provided with a through hole 124 to form a path through which the plus plate 110 and the plus terminal 21 of the power storage module 20 may be coupled with each other.

Of course, the present disclosure is not limited that arrangement. By reversing the stacking order of the positive plate 110 and the minus plate 120, the first surface 112 of the plus plate 110 may be provided with a through hole 114 to form a path through which the minus plate 120 and the minus terminal 22 of the power storage module 20 are coupled with each other.

The cooling module 30 directly cools the power module 10 and the connection module 100 that are installed to be directly contacted thereto. The connection module 100 cooled by the cooling module 30 in turn cools the power storage module 20 installed to be contacted thereto. Thus, the cooling module 30 indirectly cools the power storage module 20.

The inverter for driving a motor of a vehicle according to the exemplary embodiment of the present disclosure has the following effects.

First, it is possible to minimize the size of the power storage module by effectively cooling the power storage module.

Second, it is possible to minimize leakage inductance by connecting the power module and the power storage module using the layered planar laminate bus bar.

Although exemplary embodiments of the present disclosure have been described with reference to the accompanying drawings, those skilled in the art will appreciate that various modifications and alterations may be made without departing from the spirit or essential feature of the present disclosure.

Therefore, it should be understood that the above-mentioned embodiments are not restrictive but are exemplary in all aspects. It is to be understood that the scope of the present disclosure will be defined by the claims rather than the above-mentioned description and all modifications and alternations derived from the claims and their equivalents are included in the scope of the present disclosure.

What is claimed is:

1. An inverter for driving a motor of a vehicle mediating between a battery and a driving motor, comprising:
   a power storage module configured to be supplied with power from the battery;
   a power module configured to be supplied with power from the power storage module to transfer the power to the driving motor;
   a cooling module configured to be installed between the power storage module and the power module to simultaneously cool the power storage module and the power module: and
   a connection module configured to connect the power storage module and the power module to transfer power;
   wherein the connection module includes a plus plate connecting a plus terminal of the power storage module and a plus terminal of the power module and a minus plate connecting a minus terminal of the power storage module and a minus terminal of the power module;
   wherein the plus plate and the minus plate are stacked with each other in an insulated state;
   wherein each of the plus plate and the minus plate includes a first surface and a second surface;
   wherein the first surface of each of the plus plate and the minus plate is inserted between the power storage module and the cooling module, and the second surface of each of the plus plate and the minus plate extends along a side surface of the cooling module from one end of the first surface of each of the plus plate and the minus plate;
   wherein the first surface of the plus plate is stacked with the first surface of the minus plate, and the second surface of the plus plate is stacked with the second surface of the minus plate;
   wherein the plus plate and the minus plate are stacked with each other in a shape of a single plate that is bent vertically at least once: and
   wherein an entire lower surface of the cooling module contacts an entire upper surface of the plus plate, and an entire upper surface of the power storage module contacts an entire upper surface of the minus plate.

2. The inverter of claim 1, wherein the plus plate and the minus plate are each formed in the shape of the letter L.

3. The inverter of claim 2, wherein the connection module further includes a plus terminal extending from a second surface of the plus plate to be connected to a plus terminal of the power module and a minus terminal extending from a second surface of the minus plate to be connected to a minus terminal of the power module.

4. The inverter of claim 2, wherein the first surface of the minus plate is provided with a through hole so that the first surface of the plus plate and the plus terminal of the power storage module contact each other.

5. The inverter of claim 2, wherein the first surface of the plus plate is provided with a through hole so that the first surface of the minus plate and the minus terminal of the power storage module contact each other.

6. The inverter of claim 1, wherein the cooling module cools the connection module, and the power storage module is indirectly cooled by the connection module.

* * * * *